(12) United States Patent
Moriya (10) Patent No.: US 12,434,341 B2
(45) Date of Patent: Oct. 7, 2025

(54) ELECTROSTATIC CHUCK APPARATUS

(71) Applicant: SAMSUNG ELECTRONICS CO., LTD., Suwon-si (KR)

(72) Inventor: Yoshiaki Moriya, Kanagawa (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 321 days.

(21) Appl. No.: 18/126,017

(22) Filed: Mar. 24, 2023

(65) Prior Publication Data

US 2023/0339059 A1     Oct. 26, 2023

(30) Foreign Application Priority Data

Apr. 22, 2022  (JP) ................................. 2022-070533
Nov. 21, 2022  (KR) ......................... 10-2022-0156763

(51) Int. Cl.
| | | |
|---|---|---|
| *B23Q 11/14* | (2006.01) | |
| *B23Q 3/154* | (2006.01) | |
| *B23Q 11/12* | (2006.01) | |
| *H01L 21/683* | (2006.01) | |

(52) U.S. Cl.
CPC ............ *B23Q 11/143* (2013.01); *B23Q 3/154* (2013.01); *B23Q 11/128* (2013.01); *H01L 21/6833* (2013.01)

(58) Field of Classification Search
CPC .......................... B23Q 11/143; H01L 21/6833
See application file for complete search history.

(56) References Cited

U.S. PATENT DOCUMENTS

| | | | |
|---|---|---|---|
| 6,771,483 B2 | 8/2004 | Harada et al. | |
| 7,265,962 B2 | 9/2007 | Miyaji et al. | |
| 8,542,474 B2 | 9/2013 | Yonekura et al. | |
| 2005/0215073 A1 | 9/2005 | Nakamura et al. | |
| 2006/0081564 A1* | 4/2006 | Moroz ............. | H01J 37/32935 219/121.43 |
| 2013/0112334 A1* | 5/2013 | Tsuno ............... | H01L 21/67109 156/64 |
| 2016/0251265 A1* | 9/2016 | Takahashi .......... | H01L 21/6833 361/234 |
| 2017/0243778 A1* | 8/2017 | Kouno ................ | H01L 21/6875 |
| 2018/0053678 A1* | 2/2018 | Kugimoto ......... | H01L 21/67103 |

(Continued)

FOREIGN PATENT DOCUMENTS

| | | |
|---|---|---|
| JP | H07-183281 A | 7/1995 |
| JP | 3485390 B2 | 1/2004 |
| JP | 2005277074 A | 10/2005 |

(Continued)

*Primary Examiner* — Scott Bauer
(74) *Attorney, Agent, or Firm* — Sughrue Mion, PLLC (57) ABSTRACT

An electrostatic chuck apparatus is provided that is capable of effectively reducing temperature imbalance of a wafer substrate that is heated to a high temperature. The electrostatic chuck apparatus includes a base including a cooling flow path through which a refrigerant may flow, an adiabatic layer on the base, a uniform heating plate on the adiabatic layer, a heating element between the adiabatic layer and the uniform heating plate, an insulating layer on the uniform heating plate and including a ceramic, a conductive layer on the insulating layer and having an area smaller than an area of the insulating layer, and a dielectric layer on the conductive layer and including a ceramic.

20 Claims, 8 Drawing Sheets

(56) References Cited

U.S. PATENT DOCUMENTS

2021/0384060 A1* 12/2021 Hayashi ............ H01J 37/32807
2023/0075120 A1* 3/2023 Park .................. H01L 21/67109

FOREIGN PATENT DOCUMENTS

| | | | |
|---|---|---|---|
| JP | 2005340719 | A | 12/2005 |
| JP | 4089820 | B2 | 5/2008 |
| JP | 4272786 | B2 | 6/2009 |
| JP | 2011091297 | A | 5/2011 |
| JP | 2018056333 | A | 4/2018 |
| JP | 2019104964 | A | 6/2019 |

* cited by examiner

ELECTROSTATIC CHUCK APPARATUS

CROSS-REFERENCE TO RELATED APPLICATIONS

This application is based on and claims priority under 35 U.S.C. § 119 to Japanese Patent Application No. 2022-070533, filed on Apr. 22, 2022, in the Japanese Intellectual Property Office, and Korean Patent Application No. 10-2022-0156763, filed on Nov. 21, 2022, in the Korean Intellectual Property Office, the disclosures of which are incorporated by reference herein in their entireties.

BACKGROUND

Embodiments of the present disclosure relate to a semiconductor processing apparatus, and more particularly, to an electrostatic chuck apparatus in a process chamber used in a semiconductor manufacturing process.

An electrostatic chuck apparatus in which a substrate such as a wafer is seated and fixed may be arranged in a process chamber used in a semiconductor manufacturing process, particularly dry etching, ion implantation, chemical vapor deposition (CVD), physical vapor deposition (PVD), and the like. Recently, the driving energy of etching by itself has been insufficient to realize the progress of miniaturization of semiconductor devices and the required etching selection ratio. Therefore, a method of assisting energy by increasing the temperature of a substrate to be treated by heating a built-in heater is being reviewed.

SUMMARY

Embodiments of the present disclosure provide an electrostatic chuck apparatus capable of effectively reducing temperature imbalance of a wafer substrate heated to a high temperature.

In addition, problems to be solved by embodiments of the present disclosure are not limited to the above-mentioned problems, and other problems solved by embodiments of the present disclosure may be clearly understood by a person skilled in the art from the following description.

According to embodiments of the present disclosure, an electrostatic chuck apparatus is provided. The electrostatic chuck apparatus includes: a base including a cooling flow path, the cooling flow path configured to have a refrigerant flow therethrough; an adiabatic layer on the base; a uniform heating plate on the adiabatic layer; a heating element between the adiabatic layer and the uniform heating plate; an insulating layer on the uniform heating plate and including a ceramic; a conductive layer on the insulating layer and having an area smaller than an area of the insulating layer; and a dielectric layer on the conductive layer and including a ceramic.

According to embodiments of the present disclosure, an electrostatic chuck apparatus is provided. The electrostatic chuck apparatus includes: a base including a cooling flow path; an adiabatic layer on the base; a heating element in the adiabatic layer; a uniform heating plate on the adiabatic layer and configured to uniformly transfer heat from the adiabatic layer to an upper portion of the uniform heating plate; an insulating layer on the uniform heating plate; a conductive layer on the insulating layer and having an area smaller than an area of the insulating layer; and a dielectric layer on the conductive layer and covering at least a top surface of the conductive layer.

According to embodiments of the present disclosure, an electrostatic chuck apparatus is provided. The electrostatic chuck apparatus includes: a base including a cooling flow path, the cooling flow path configured to have a refrigerant flow therethrough; an adiabatic layer on the base; a heating element within the adiabatic layer; a uniform heating plate on the adiabatic layer and configured to uniformly transfer heat from the adiabatic layer to an upper portion of the uniform heating plate; an insulating layer on the uniform heating plate and including a ceramic; a conductive layer on the insulating layer and having an area smaller than an area of the insulating layer; a dielectric layer on the conductive layer and including a ceramic; and a dense layer on the dielectric layer.

BRIEF DESCRIPTION OF DRAWINGS

Embodiments of the present disclosure will be more clearly understood from the following detailed description taken in conjunction with the accompanying drawings in which.

DETAILED DESCRIPTION

Hereinafter, non-limiting example embodiments of the present disclosure will be described in detail with reference to the accompanying drawings. The same reference numerals are used for the same components in the drawings, and redundant descriptions thereof may be omitted.

It will be understood that when an element or layer is referred to as being "on," "connected to," or "coupled to" another element or layer, it can be directly on, connected to, or coupled to the other element or layer or intervening elements or layers may be present. In contrast, when an element or layer is referred to as being "directly on," "directly connected to," or "directly coupled to" another element or layer, there are no intervening elements or layers present.

Figure 1:
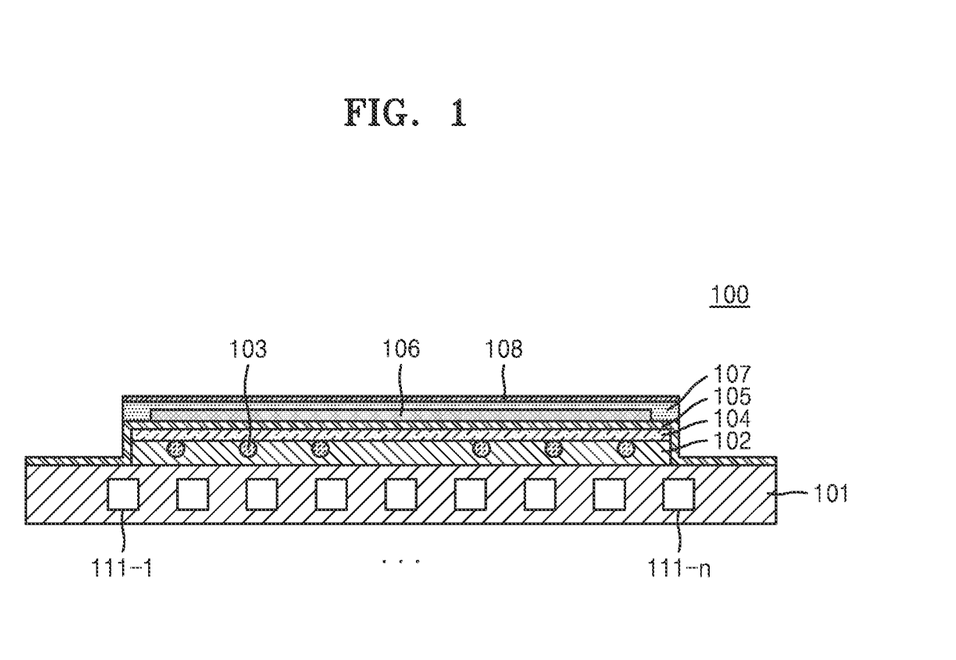
FIG. 1 is a cross-sectional view schematically illustrating an electrostatic chuck apparatus according to an embodiment of the present disclosure.

FIG. 1 is a cross-sectional view schematically illustrating an electrostatic chuck apparatus according to an embodiment of the present disclosure.

Referring to FIG. 1, an electrostatic chuck apparatus 100 according to the embodiment may include a base 101, an adiabatic layer 102, at least one heating element 103, a uniform heating plate 104, an insulating layer 105, a conductive layer 106, a dielectric layer 107, and a dense layer 108.

The base 101 may have cooling flow paths 111-1 to 111-$n$ through which refrigerants may flow. The base 101 may include, for example, titanium. The base 101 may have a thermal expansion rate difference less than $1*0^{-5}/°$ C. between a thermal expansion rate of a material constituting the base 101 and thermal expansion rates of respective materials constituting the insulating layer 105, the conductive layer 106, the dielectric layer 107, and the dense layer 108. In addition, the base 101 may include a material having a thermal conductivity of about 50 W/m·K or more. For example, the base 101 may include at least one of Al, Si, and Ti.

The adiabatic layer 102 may be arranged on the base 101. The adiabatic layer 102 may include at least one of Al, Si, and Y. In addition, the thermal conductivity of the adiabatic layer 102 may be about 3.0 W/m·K or less.

The at least one heating element 103 may be placed between the adiabatic layer 102 and the uniform heating plate 104. For example, at least one groove may be formed in the adiabatic layer 102, and the at least one heating element 103 may be arranged in the at least one groove. The heating element 103 may include at least one of C, Ti, W, Si, Al, Y, and Mo. The heating element 103 may generate heat at about 300° C. or higher through power applied thereto. For example, the heating element 103 may have a structure in which a wire having a diameter of about 500 μm to about 10 mm is processed into a coil shape having an average diameter of about 10 mm or less. In addition, the heating element 103 may be a foil with a thickness of about 100 μm to about 5 mm, and may be manufactured by applying either laser, wet etching, or blast processing to the shape of the heating element 103. The heating element 103 may include at least one of C, Ti, W, Si, Al, Y, and Mo.

The uniform heating plate 104 may have a structure and heat transfer characteristics that transfer, as evenly as possible, heat generated from the at least one heating element 103 to a substrate (e.g., a Si wafer) suctioned by an electrostatic chuck. Specifically, the uniform heating plate 104 may diffuse heat generated from the at least one heating element 103 in a radial direction. The uniform heating plate 104 may have high thermal conductivity of, for example, about 150 W/m·K or more. In addition, the uniform heating plate 104 may have, for example, an insulating property of about $1.0*10^{10}$ Ω·cm or more. Furthermore, the uniform heating plate 104 may have a low thermal expansion rate of, for example, about $7*10^{-6}/K$ or less. For example, the uniform heating plate 104 may include aluminum nitride (AlN). However, the thermal conductivity, insulating, thermal expansion rate, and material of the uniform heating plate 104 are not limited to the ranges and materials described above. Meanwhile, the uniform heating plate 104 may include a material having different thermal conductivity in a vertical direction and a horizontal direction with respect to the thickness direction of the heating element 103. In addition, the uniform heating plate 104 may be arranged on the adiabatic layer 102.

The insulating layer 105 may be arranged above the heating element 103. In addition, the insulating layer 105 may include ceramic. For example, the insulating layer 105 may be an alumina ($Al_2O_3$) spray layer. More specifically, the insulating layer 105 may include an $Al_2O_3$ spray layer having a thickness of about 300 μm to about 600 μm. In addition, the insulating layer 105 may include a ceramic material having a thickness of about 1 mm to about 2 mm. However, the material and thickness of the insulating layer 105 are not limited to the materials and numerical ranges described above. For example, the insulating layer 105 may include at least one of Al, Y, Si, Ti, and W. The insulating layer 105 may have, for example, a volume resistance value of about $1.0*10^{10}$ Ω·cm or more at 400° C.

The conductive layer 106 may be arranged on the insulating layer 105. The conductive layer 106 may function as an adsorption electrode. The conductive layer 106 may have an area smaller than an area of the insulating layer 105. The conductive layer 106 may be a Ti layer. The conductive layer 106 may have a thickness of about 5 μm to about 300 μm. However, the material and thickness of the conductive layer 106 are not limited to the material and numerical range described above. For example, the conductive layer 106 may include at least one of Ti, W, Si, and Al.

The dielectric layer 107 may be arranged on the conductive layer 106. In addition, the dielectric layer 107 may include a ceramic material. For example, the dielectric layer 107 may include an $Al_2O_3$ spray layer. The dielectric layer 107 may have a thickness of about 300 μm to about 600 μm. In addition, the dielectric layer 107 may have a thickness of about 300 μm to about 700 μm. The dielectric layer 107 may include, for example, at least one of Al, Y, Si, Ti, and W. The dielectric layer 107 may have, for example, a volume resistance value of about $1.0*10^{10}$ Ω·cm or more at 400° C. Convex portions of the dielectric layer 107, having a diameter of about 0.5 mm to about 5 mm and a height of about 5 μm to about 50 μm, may be formed to be about 50% or less of an area of a one-way surface of the dielectric layer 107.

The insulating layer 105, the conductive layer 106, and the dielectric layer 107 may be formed by a plasma spraying method, a CVD method, a sputtering method, an ion plating method, or may be formed of a foil having a thickness of about 100 μm or less.

The dense layer 108 may be arranged on the dielectric layer 107. The dense layer 108 may have any configuration. For example, the dense layer 108 may be an $Al_2O_3$ layer or an $Y_2O_3$ layer. In addition, the dense layer 108 may include at least one of Ti, W, Si, Al, and Y. According to some embodiments, the dense layer 108 may be omitted.

In a first embodiment, a material of each component of the electrostatic chuck apparatus 100 of FIG. 1 is as follows. The base 101 may include Ti, the insulating layer 105 may include an $Al_2O_3$ spray layer, the conductive layer 106 may include a Ti layer, the dielectric layer 107 may include an $Al_2O_3$ spray layer, and the dense layer 108 may include an $Al_2O_3$ layer.

In a second embodiment, a material of each component of the electrostatic chuck apparatus 100 of FIG. 1 is as follows. The base 101 may include Ti, the insulating layer 105 may include an $Al_2O_3$ spray layer, the conductive layer 106 may include a Ti layer, the dielectric layer 107 may include an $Al_2O_3$ spray layer, and the dense layer 108 may include an $Y_2O_3$ layer.

In a third embodiment, a material of each component of the electrostatic chuck apparatus 100 of FIG. 1 is as follows. The base 101 may include Ti, the insulating layer 105 may include an $Al_2O_3$ spray layer, the conductive layer 106 may include a TiN layer, and the dielectric layer 107 may include an $Al_2O_3$ spray layer. Meanwhile, the dense layer 108 may be omitted.

In a fourth embodiment, a material of each component of the electrostatic chuck apparatus 100 of FIG. 1 is as follows. The base 101 may include Ti, a bonding layer may include Ti alloy-based active metal solder, the insulating layer 105 may include an $Al_2O_3$ ceramic, the conductive layer 106 may include a TiN layer, and the dielectric layer 107 may include $Al_2O_3$ ceramic. In the first to third embodiments, the insulating layer 105 and the dielectric layer 107 may be formed of spray layers, and in the fourth embodiment, the insulating layer 105 and the dielectric layer 107 may be formed of ceramic.

Example materials of components of the electrostatic chuck apparatus 100 have been described above, but the material of each component of the electrostatic chuck apparatus 100 is not limited to the aforementioned materials.

FIGS. 2A to 2G are cross-sectional views schematically showing a method of manufacturing the electrostatic chuck apparatus 100 of FIG. 1. Repeated descriptions of the features previously described with reference to FIG. 1 may be briefly given or omitted.

Figure 2A:
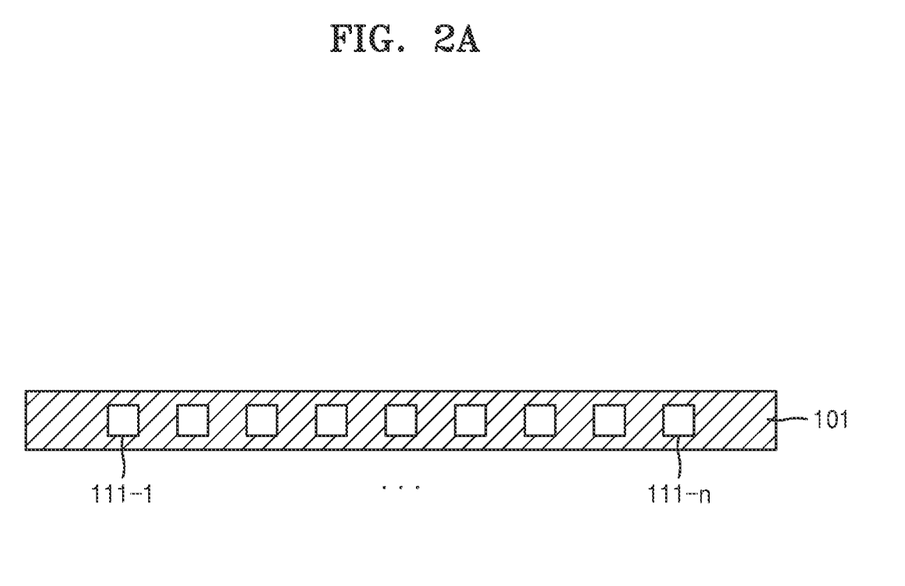
FIG. 2A is a first cross-sectional view schematically showing a method of manufacturing the electrostatic chuck apparatus of FIG. 1.

Referring to FIG. 2A, according to a method of manufacturing an electrostatic chuck apparatus, according to the present embodiment, (hereinafter, referred to as an "electrostatic chuck apparatus manufacturing method"), a base 101 is first formed. Specifically, Ti plates processed with grooves serving as cooling flow paths 111-1 to 111-n are formed by machining. Thereafter, the Ti plates are bonded to each other by active metal solder or diffusion of Ti to form the base 101 containing cooling flow paths 111-1 to 111-n. After bonding between the Ti plates, machining may be performed again to process the base 101 into a particular shape.

Figure 2B:
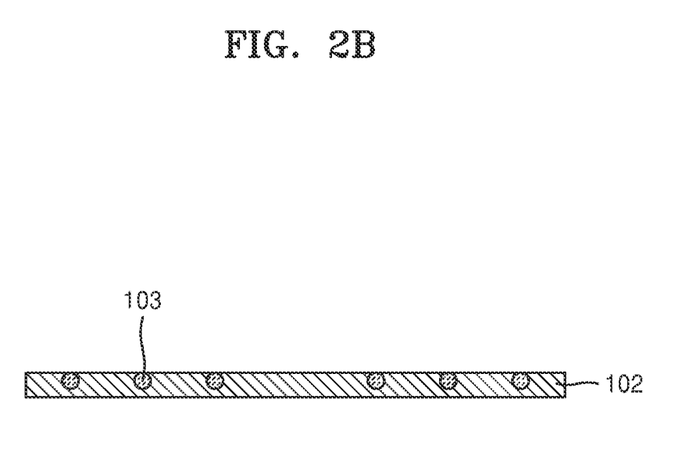
FIG. 2B is a second cross-sectional view schematically showing the method of manufacturing the electrostatic chuck apparatus of FIG. 1.

Referring to FIG. 2B, after the base 101 is formed, an adiabatic layer 102 is formed on the base 101. In addition, the adiabatic material of the adiabatic layer 102 is machined into a particular shape, and at least one groove into which the at least one heating element 103 enters is formed.

Meanwhile, for each heating element 103, a titanium wire of a diameter for the heating element 103 is processed into a coil shape, and a terminal for a power feed is installed at the end of the heating element 103 by welding. Thereafter, the at least one heating element 103 provided with the power feed terminal is inserted into the at least one groove in the adiabatic layer 102.

Figure 2C:
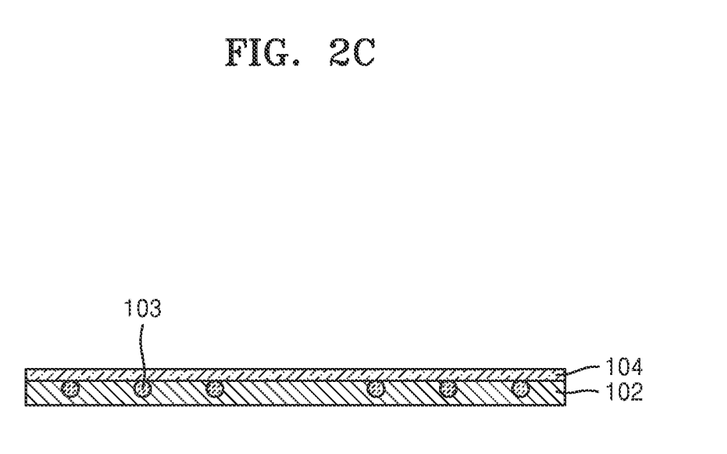
FIG. 2C is a third cross-sectional view schematically showing the method of manufacturing the electrostatic chuck apparatus of FIG. 1.

Referring to FIG. 2C, after inserting the at least one heating element 103 in the at least one groove of the adiabatic layer 102, a uniform heating plate 104, that may comprise an AlN ceramic, is adhered and fixed using an inorganic adhesive to the adiabatic layer 102 into which the at least one heating element 103 is inserted. The uniform heating plate 104 may be formed in a shape required through machining.

Figure 2D:
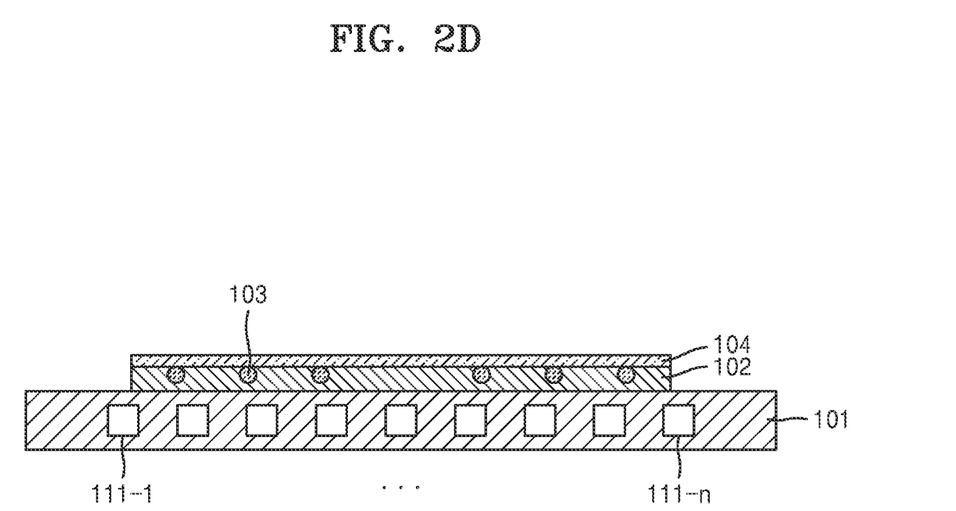
FIG. 2D is a fourth cross-sectional view schematically showing the method of manufacturing the electrostatic chuck apparatus of FIG. 1.

Referring to FIG. 2D, the uniform heating plate 104 and the adiabatic layer 102 having the at least one heating element 103 mounted thereon are adhered and fixed to the installation surface on the base 101, which may comprise titanium, using a silicone adhesive.

Figure 2E:
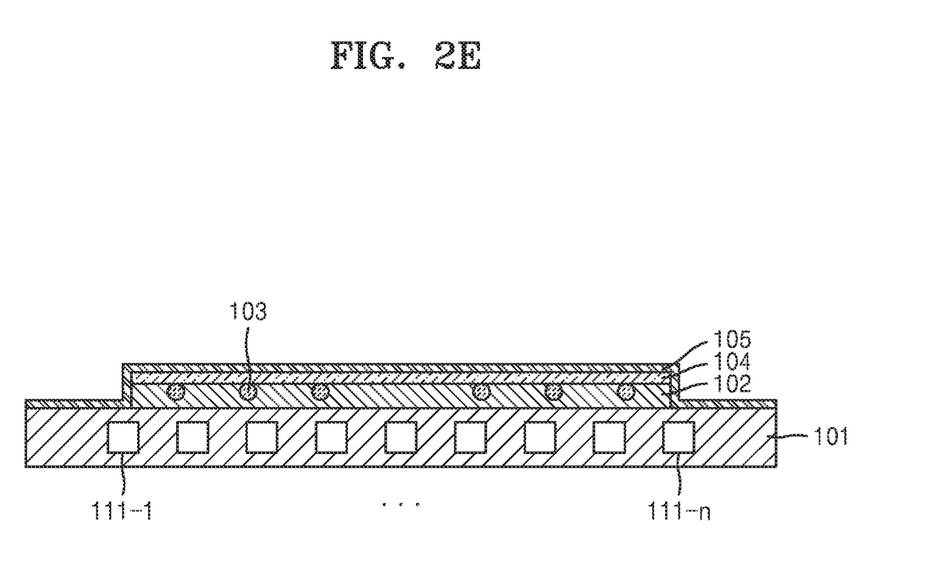
FIG. 2E is a fifth cross-sectional view schematically showing the method of manufacturing the electrostatic chuck apparatus of FIG. 1.

Referring to FIG. 2E, after installing an insulator component on the base 101 (e.g., a cooling base), an insulating layer 105 is formed by depositing, by a thermal spraying method, on the surface of the base 101, an $Al_2O_3$ material for insulating treatment of the base 101.

Figure 2F:
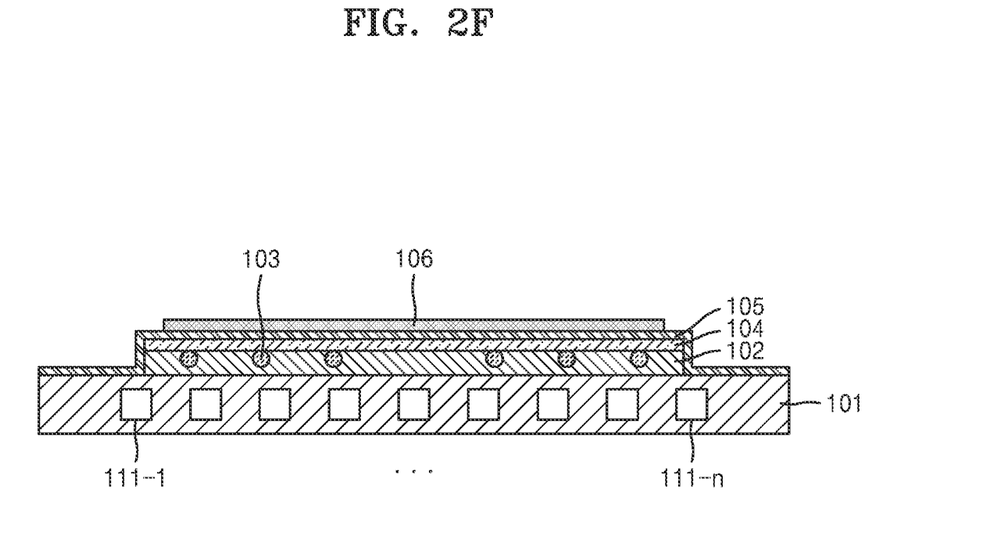
FIG. 2F is a sixth cross-sectional view schematically showing the method of manufacturing the electrostatic chuck apparatus of FIG. 1.

Referring to FIG. 2F, after the insulating layer 105 is formed, a conductive layer 106 is formed by forming, by a thermal spraying method, a Ti layer on the placement surface of the insulating layer 105 so as to be smaller than the diameter of the placement surface of the insulating layer 105.

Figure 2G:
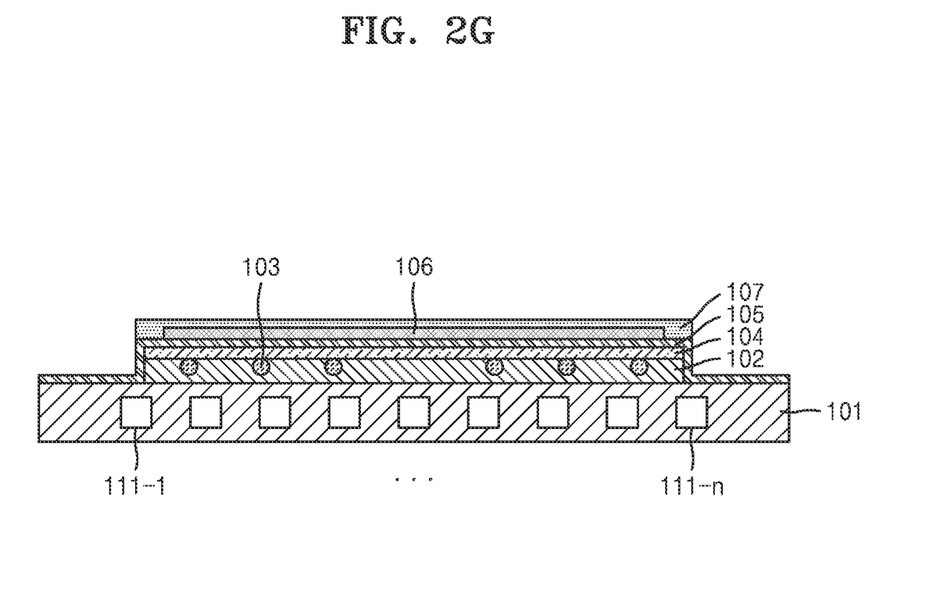
FIG. 2G is a seventh cross-sectional view schematically showing the method of manufacturing the electrostatic chuck apparatus of FIG. 1.

Referring to FIG. 2G, after the conductive layer 106 is formed, a dielectric layer 107 is formed by depositing an $Al_2O_3$ material by thermal spraying to cover the conductive layer 106 of the Ti layer. In addition, the surface of the $Al_2O_3$ spray layer is polished and blast processed to form a convex portion on the upper surface of the dielectric layer 107.

Thereafter, a dense layer 108 (refer to FIG. 1) is formed by forming the $Al_2O_3$ layer by an ion plating method by a thickness of about 5 μm. Meanwhile, the dense layer 108 may be omitted according to an embodiment.

An evaluation method of the electrostatic chuck apparatus 100 of FIG. 1 manufactured by the method described above is as follows.

Defect inspection is performed on the electrostatic chuck apparatus 100, on the side of the dense layer 108 (e.g., an upper surface of the electrostatic chuck apparatus 100), by an ultrasonic wave detection device. When there are no major defects between the laminated layers and the bonding area is about 99% or more, it is determined to be acceptable.

In addition, it is confirmed that the temperature of an object (e.g., wafer) to be suctioned is about 300° C. or higher by flow of current through the at least one heating element 103 in the electrostatic chuck apparatus 100.

After performing the suction and de-suction cycle of an object (wafer) to be suctioned about 300 times or so, it is confirmed that there is no change in the oscillation.

After the above tests, a defect test is performed again with an ultrasonic wave detection device to confirm that there is no change after bonding.

For reference, when measuring the wafer temperature imbalance by applying 3 kW of heat while suctioning and fixing the wafer substrate to the electrostatic chuck apparatus 100 of the first embodiment, it was confirmed that the temperature imbalance of the wafer substrate is within ±3° C.

In addition, as in the first embodiment, the temperature imbalance of the wafer substrate was confirmed to be within ±3° C. in the electrostatic chuck apparatuses 100 of the second and third embodiments.

As a result, according to the electrostatic chuck apparatus 100 of the embodiments described above, it is possible to effectively reduce the temperature imbalance of the wafer substrate that is heated to about 300° C. or higher.

Meanwhile, a method of manufacturing the electrostatic chuck apparatus 100, according to the fourth embodiment, will be described below with reference to FIGS. 2A to 2E.

Referring to FIG. 2A, first, a base 101 is formed. Specifically, Ti plates processed with grooves serving as cooling flow paths 111-1 to 111-n are formed by machining. Thereafter, the Ti plates are bonded to each other by active metal solder or diffusion of Ti to form the base 101 containing cooling flow paths 111-1 to 111-n. After bonding between the Ti plates, machining may be performed again to process the base 101 into a particular shape.

Referring to FIG. 2B, after the base 101 is formed, an adiabatic layer 102 is formed on the base 101. In addition, the adiabatic material of the adiabatic layer 102 is machined into a specific shape, and at least one groove into which the at least one heating element 103 enters is formed.

Meanwhile, for each heating element 103, a titanium wire of a diameter for the heating element 103 is processed into a coil shape, and a terminal for a power feed is installed at the end of the heating element 103 by welding. Thereafter, the heating element 103 provided with the power feed terminal is inserted into the groove in the adiabatic layer 102.

Referring to FIG. 2C, after inserting the at least one heating element 103 in the at least one groove of the adiabatic layer 102, a uniform heating plate 104, that may comprise an AlN ceramic, is adhered and fixed, using an inorganic adhesive, to the adiabatic layer 102 into which the at least one heating element 103 is inserted. The uniform heating plate 104 may be formed in a specific shape through machining.

Referring to FIG. 2D, the uniform heating plate 104 and the adiabatic layer 102 having the at least one heating element 103 mounted thereon are adhered and fixed to the installation surface on the base 101, which may comprise titanium, using a silicone adhesive.

Referring to FIG. 2E, after installing an insulator component on the base 101, an insulating layer 105 may be formed by depositing, by a thermal spraying method, on the surface of the base 101, an $Al_2O_3$ material for insulating treatment of the base 101.

Thereafter, the conductive layer 106 and the dielectric layer 107 are manufactured in a form in which an internal electrode (i.e., the conductive layer 106) is embedded in the dielectric layer 107 using a ceramic heater manufacturing method.

Between the bonding surfaces of the conductive layer 106 and the dielectric layer 107 to the insulating layer 105 of the base 101, a load is applied to reach 3 kPa with a titanium alloy-based active metal solder in between, and heated at about 700° C. for about three hours. Depending on the embodiment, the load may not be applied. However, when the thickness is precisely controlled, a load of 1 kPa or more may be applied.

After three hours with the load applied, the heating is stopped and cooled. It may then be confirmed that the solder has solidified by cooling to room temperature.

Thereafter, defect inspection of the bonding layer is performed at the side of the dielectric layer 107 of the electrostatic chuck apparatus with an ultrasonic wave detection device. When there are no major defects in the bonding layer between the dielectric layer 107 and the insulating layer 105, and the bonding area is about 99% or more, the electrostatic chuck apparatus may be determined to be acceptable.

After soldering, the surface of the dielectric layer 107 is polished to process the thickness of the dielectric layer 107 to be about 0.5 mm.

Thereafter, a convex portion having φ about 1 mm (diameter)*about 30 μm (height) is formed on the polishing surface of the dielectric layer 107 by sandblast processing.

An evaluation method of the electrostatic chuck apparatus 100 of the fourth embodiment manufactured by the method described above is as follows.

Defect inspection is performed by an ultrasonic wave detection device at the side of the dense layer 108 of the electrostatic chuck apparatus 100. When there are no major defects between the laminated layers and the bonding area is about 99% or more, the electrostatic chuck apparatus 100 may be determined to be acceptable.

In addition, it is confirmed that the temperature of an object (e.g., a wafer) to be suctioned is about 300° C. or higher by the flow of current through the at least one heating element 103 in the electrostatic chuck apparatus 100.

After performing the suction and de-suction cycle of an object (e.g., the wafer) to be suctioned about 300 times, it is confirmed that there is no change in the oscillation.

After the above tests, a defect test is performed again on the object (e.g., the wafer) with an ultrasonic wave detection device to confirm that there is no change after bonding.

For reference, when measuring the wafer temperature imbalance by applying 3 kW of heat while suctioning and fixing the wafer substrate to the electrostatic chuck apparatus 100 of the fourth embodiment, it is confirmed that the temperature imbalance of the wafer substrate is within ±3° C.

As described above, according to the electrostatic chuck apparatus 100 of the fourth embodiment, an insulating layer and a dielectric layer may be implemented as ceramic.

According to the electrostatic chuck apparatus 100 of the present embodiment, the temperature of the wafer substrate may be efficiently heated to about 300° C. or more. According to the electrostatic chuck apparatus 100 of the present embodiment, exfoliation and destruction may be reduced. In addition, the dielectric layer may not be exposed to plasma and thus may not be worn well. According to the electrostatic chuck apparatus 100 of the present embodiment, an insulating layer and a dielectric layer may be implemented by lamination using thermal spraying. As a result, an electrostatic chuck using a thermal spraying layer is inexpensive, and repair thereof may be facilitated.

According to the electrostatic chuck apparatus 100 of the present embodiment, when a chip is set to about 300° C. or higher, deformation of a base may be reduced. According to the electrostatic chuck apparatus 100 of the present embodiment, the probability of short circuits may be reduced. According to the electrostatic chuck apparatus 100 of the present embodiment, the dielectric layer may not be worn well even if the dielectric layer is exposed to or slid on the plasma.

According to the electrostatic chuck apparatus 100 of the present embodiment, thermal resistance may be minimized. According to the electrostatic chuck apparatus 100 of the present embodiment, it is possible to reduce the risk of disconnection due to thermal expansion or heat shrinkage of the heating element. According to the electrostatic chuck apparatus 100 of the present embodiment, the thickness of the electrostatic chuck apparatus 100 may be reduced. According to the electrostatic chuck apparatus 100 of the present embodiment, heat transfer to a substrate may be more smoothly performed. According to the electrostatic chuck apparatus 100 of the present embodiment, it is possible to reduce the probability that dust adheres to the rear surface of a Si wafer. In addition, heat conduction may be made uniform by gas flowing in the concave portion.

In an embodiment of the present disclosure, the electrostatic chuck apparatus may reduce temperature imbalance of a wafer substrate that is heated to about 300° C. or higher.

In an embodiment of the present disclosure, in an electrostatic chuck apparatus, a heating element may include at least one of C, Ti, W, Si, Al, Y, and Mo, and the heating element may generate heat at about 300° C. or higher by applying power thereto. In addition, an adiabatic layer may include at least one of Al, Si, and Y, and the heat conductivity of the adiabatic layer may be about 3.0 W/mK or less.

In an embodiment of the present disclosure, an electrostatic chuck apparatus may efficiently heat the temperature of a wafer substrate to about 300° C. or higher.

In an embodiment of the present disclosure, an electrostatic chuck apparatus may include a dense layer formed on a dielectric layer. In addition, a base may have a thermal expansion rate difference less than about $1*10^{-5}/°$ C. from thermal expansion rates of respective materials constituting an insulating layer, a conductive layer, a dielectric layer, and a dense layer, and have a thermal conductivity equal to or greater than about 50 W/mK.

In an embodiment of the present disclosure, an electrostatic chuck apparatus may reduce exfoliation and destruction. In addition, a dielectric layer may not be exposed to plasma and thus may not be worn well.

In an embodiment of the present disclosure, in an electrostatic chuck apparatus, the thickness of an insulating layer may be about 300 µm to about 600 µm, and the thickness of a dielectric layer may be about 300 µm to about 600 µm. In addition, a conductive layer may have a thickness of about 5 µm to about 300 µm.

In an embodiment of the present disclosure, in an electrostatic chuck apparatus, an insulating layer and a dielectric layer may be implemented by lamination using thermal spraying. As a result, an electrostatic chuck using a thermal spraying layer is inexpensive, and repair thereof may be facilitated.

In an embodiment of the present disclosure, in an electrostatic chuck apparatus, an insulating layer may have a thickness of about 1 mm to about 2 mm, a dielectric layer may have a thickness of about 300 µm to about 700 µm, and an conductive layer may be a ceramic material having a thickness of about 5 µm to about 300 µm. In addition, an insulating layer may be fixed to a base by a metal solder.

In an embodiment of the present disclosure, in an electrostatic chuck apparatus, an insulating layer and a dielectric layer may be made of ceramic.

In an embodiment of the present disclosure, in an electrostatic chuck apparatus, a base may include at least one of Al, Si, and Ti.

In an embodiment of the present disclosure, when a chip is heated to about 300° C. or higher in an electrostatic chuck apparatus, deformation of a base may be reduced.

In one embodiment of the present disclosure, in an electrostatic chuck apparatus, an insulating layer and a dielectric layer may include at least one of Al, Y, Si, Ti, and W, and the insulating layer and the dielectric layer may have a volume resistivity of about $1.0*10^{10}$ Ω·cm or more at about 400° C.

In one embodiment of the present disclosure, an electrostatic chuck apparatus the probability of the occurrence of a short circuit may be reduced.

In an embodiment of the present disclosure, in an electrostatic chuck apparatus, a conductive layer may include at least one of Ti, W, Si, and Al.

In an embodiment of the present disclosure, an electrostatic chuck apparatus may not wear well even when exposed to or slid by plasma.

In an embodiment of the present disclosure, in an electrostatic chuck apparatus, a dense layer may include at least one of Ti, W, Si, Al, and Y.

In an embodiment of the present disclosure, in an electrostatic chuck apparatus, an insulating layer, a conductive layer, and a dielectric layer may be formed by a plasma spraying method, a CVD method, a sputtering method, an ion plating method, or may be formed of a foil having a thickness of about 100 µm or less.

In an embodiment of the present disclosure, an electrostatic chuck apparatus may minimize thermal resistance.

In an embodiment of the present disclosure, in an electrostatic chuck apparatus, a heating element may be formed by processing a wire having a diameter of about 500 µm to about 10 mm into a coil shape having an average diameter of about 10 mm or less.

In an embodiment of the present disclosure, in an electrostatic chuck apparatus, it is possible to reduce the risk of disconnection due to thermal expansion or heat shrinkage of a heating element.

In an embodiment of the present disclosure, in an electrostatic chuck apparatus, a heating element is a foil having a thickness of about 100 µm to about 5 mm and may be manufactured in the shape of the heating element by any one of laser, wet etching, and blast processing.

In an embodiment of the present disclosure, an electrostatic chuck apparatus may have a reduced thickness.

In an embodiment of the present disclosure, in an electrostatic chuck apparatus, a heating element may include at least one of C, Ti, W, Si, Al, Y, and Mo. In addition, a uniform heating plate may be made of a material having different thermal conductivity in a vertical direction and a horizontal direction with respect to the thickness direction of the heating element.

In an embodiment of the present disclosure, in an electrostatic chuck apparatus, the heat transfer to a substrate may be performed more smoothly.

In an embodiment of the present disclosure, in an electrostatic chuck apparatus, the dielectric layer may include a convex portion having a diameter of about 0.5 mm to about 5 mm and a height of about 5 µm to about 50 µm to be about 50% or less of an area of a one-way surface (e.g., a flat surface) of the dielectric layer.

In an embodiment of the present disclosure, in an electrostatic chuck apparatus, it is possible to reduce the probability that dust adheres to the rear surface of a Si wafer. In addition, heat conduction may be made uniform in the gas flowing into the concave portion.

Embodiments of the present disclosure are not limited to the above example embodiments, and may be appropriately changed without departing from the spirit of the present disclosure. For example, a layer for adhesion or bonding between the respective layers may be provided.

For reference, in general, a wafer substrate is heated to about 300° C. or more (e.g., about 500° C.), but the etching atmosphere is cooled to about 70° C. or less, so the wafer substrate may suffer heat loss at the same time as heating. As a result, in the case of a conventional electrostatic chuck apparatus, there is a problem that the heating imbalance is greatly reflected in the temperature imbalance of the wafer substrate. An electrostatic chuck apparatus of embodiments of the present disclosure may effectively solve the above problem.

While non-limiting example embodiments of the present disclosure have been particularly shown and described with reference to the drawings, it will be understood that various changes in form and details may be made to the embodiments without departing from the spirit and scope of the present disclosure.

What is claimed is:

1. An electrostatic chuck apparatus comprising:
   a base comprising a cooling flow path, the cooling flow path configured to have a refrigerant flow therethrough;
   an adiabatic layer on the base;
   a uniform heating plate on the adiabatic layer;
   a heating element between the adiabatic layer and the uniform heating plate;
   an insulating layer on the uniform heating plate, the insulating layer comprising a ceramic;
   a conductive layer on the insulating layer, the conductive layer having an area smaller than an area of the insulating layer; and
   a dielectric layer on the conductive layer, the dielectric layer comprising a ceramic,
   wherein the uniform heating plate has a uniform thickness and comprises a material having different thermal conductivity in a vertical direction and a horizontal direction with respect to a thickness direction of the heating element.

2. The electrostatic chuck apparatus of claim 1, wherein the heating element comprises at least one from among C, Ti, W, Si, Al, Y, and Mo,
wherein the heating element is configured to generate heat at a temperature of 300° C. or higher by a supply of power,
wherein the adiabatic layer comprises at least one from among Al, Si, and Y, and
wherein a thermal conductivity of the adiabatic layer is 3.0 W/mK or less.

3. The electrostatic chuck apparatus of claim 1, further comprising a dense layer on the dielectric layer,
wherein the base comprises a material having a thermal expansion rate difference less than $1*10^{-5}$/° C. from thermal expansion rates of respective materials constituting the insulating layer, the conductive layer, the dielectric layer, and the dense layer, and
wherein the material of the base has a thermal conductivity equal to or greater than 50 W/mK.

4. The electrostatic chuck apparatus of claim 1, wherein the insulating layer has a thickness of 300 μm to 600 μm,
wherein the dielectric layer has a thickness of 300 μm to 600 μm, and
wherein the conductive layer has a thickness of 5 μm to 300 μm.

5. The electrostatic chuck apparatus of claim 1, wherein the insulating layer comprises a ceramic material having a thickness of 1 mm to 2 mm,
wherein the dielectric layer is made of a ceramic material having a thickness of 300 μm to 700 μm,
wherein the conductive layer is made of a ceramic material having a thickness of 5 μm to 300 μm, and
wherein the insulating layer is fixed to the base with a metal solder material.

6. The electrostatic chuck apparatus of claim 1, wherein the base comprises at least one from among Al, Si, and Ti.

7. The electrostatic chuck apparatus of claim 1, wherein the insulating layer and the dielectric layer each comprise at least one from among Al, Y, Si, Ti, and W, and
wherein the insulating layer and the dielectric layer each have a volume resistivity of $1.0*10^{10}$ Ωcm or more at 400° C.

8. The electrostatic chuck apparatus of claim 1, wherein the conductive layer comprises at least one from among Ti, W, Si, and Al.

9. The electrostatic chuck apparatus of claim 3, wherein the dense layer comprises at least one from among Ti, W, Si, Al, and Y.

10. The electrostatic chuck apparatus of claim 1, wherein the insulating layer, the conductive layer, and the dielectric layer are formed by plasma spraying, chemical vapor deposition (CVD), sputtering, ion plating, or a foil having a thickness of 100 μm or less.

11. The electrostatic chuck apparatus of claim 1, wherein the heating element is formed by processing a wire having a diameter of 500 μm to 10 mm into a coil shape having an average diameter of 10 mm or less.

12. The electrostatic chuck apparatus of claim 1, wherein the heating element comprises a foil having a thickness of 100 μm to 5 mm, and
a shape of the heating element is processed by any one from among laser, wet etching, and blast processing.

13. The electrostatic chuck apparatus of claim 1, wherein the heating element comprises at least one from among C, TiW, Si, Al, Y, and Mo.

14. The electrostatic chuck apparatus of claim 1, wherein the dielectric layer comprises a convex portion that has a diameter of 0.5 mm to 5 mm and a height of 5 μm to 50 μm, and an area of the convex portion is equal to or less than 50% of an area of a one-way surface of the dielectric layer.

15. An electrostatic chuck apparatus comprising:
a base comprising a cooling flow path;
an adiabatic layer on the base;
a heating element in the adiabatic layer;
a uniform heating plate on the adiabatic layer, the uniform heating plate being configured to uniformly transfer heat from the adiabatic layer to an upper portion of the uniform heating plate;
an insulating layer on the uniform heating plate;
a conductive layer on the insulating layer, the conductive layer having an area smaller than an area of the insulating layer; and
a dielectric layer on the conductive layer, the dielectric layer covering at least a top surface of the conductive layer,
wherein the uniform heating plate has a uniform thickness and comprises a material having different thermal conductivity in a vertical direction and a horizontal direction with respect to a thickness direction of the heating element.

16. The electrostatic chuck apparatus of claim 15, wherein the heating element comprises at least one from among C, Ti, W, Si, Al, Y, and Mo,
wherein the heating element is configured to generate heat at a temperature of 300° C. or higher by a supply of power to the heating element, and
wherein the adiabatic layer comprises at least one from among Al, Si, and Y, and
wherein a thermal conductivity of the adiabatic layer is 3.0 W/mK or less.

17. The electrostatic chuck apparatus of claim 15, further comprising a dense layer on the dielectric layer,
wherein the base comprises a material having a thermal expansion rate difference less than $1*10^{-5}$/° C. from thermal expansion rates of respective materials constituting the insulating layer, the conductive layer, the dielectric layer, and the dense layer, and
wherein the material of the base has a thermal conductivity equal to or greater than 50 W/mK.

18. The electrostatic chuck apparatus of claim 15, wherein the insulating layer and the dielectric layer each comprise at least one from among Al, Y, Si, Ti, and W, and
wherein the insulating layer and the dielectric layer each have a volume resistivity of $1.0*10^{10}$ Ωcm or more at 400° C.

19. The electrostatic chuck apparatus of claim 15, wherein the heating element comprises at least one from among C, Ti W, Si, Al, Y, and Mo.

20. An electrostatic chuck apparatus comprising:
a base comprising a cooling flow path, the cooling flow path configured to have a refrigerant flow therethrough;
an adiabatic layer on the base;
a heating element within the adiabatic layer;
a uniform heating plate on the adiabatic layer, the uniform heating plate being configured to uniformly transfer heat from the adiabatic layer to an upper portion of the uniform heating plate;
an insulating layer on the uniform heating plate, the insulating layer comprising a ceramic;
a conductive layer on the insulating layer, the conductive layer having an area smaller than an area of the insulating layer;
a dielectric layer on the conductive layer, the dielectric layer comprising a ceramic; and a dense layer on the dielectric layer,
wherein the uniform heating plate has a uniform thickness and comprises a material having different thermal conductivity in a vertical direction and a horizontal direction with respect to a thickness direction of the heating element.

\* \* \* \* \*